(12) United States Patent
Tsunoda et al.

(10) Patent No.: US 6,458,719 B1
(45) Date of Patent: Oct. 1, 2002

(54) LOW DIELECTRIC CONSTANT FILM COMPOSED OF BORON, NITROGEN, AND HYDROGEN HAVING THERMAL RESISTANCE, PROCESS FOR FORMING THE FILM, USE OF THE FILM BETWEEN SEMICONDUCTOR DEVICE LAYERS, AND THE DEVICE FORMED FROM THE FILM

(75) Inventors: Sei Tsunoda; Hideharu Nobutoki; Noboru Mikami, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/941,766

(22) Filed: Aug. 30, 2001

(51) Int. Cl.[7] ................. H01L 21/31; H01L 21/469; C23C 8/54
(52) U.S. Cl. ................. 438/778; 438/622; 257/758; 427/590
(58) Field of Search ................. 438/622, 778; 257/758; 427/590

(56) References Cited

U.S. PATENT DOCUMENTS

| | | | | |
|---|---|---|---|---|
| 5,518,780 A | * | 5/1996 | Tamor et al. | 427/255.38 |
| 5,855,962 A | * | 1/1999 | Cote et al. | 427/376.2 |
| 6,165,891 A | * | 12/2000 | Chooi et al. | 257/758 |

FOREIGN PATENT DOCUMENTS

| | | | | |
|---|---|---|---|---|
| JP | 61188963 A | * | 8/1986 | H01L/27/14 |
| JP | 63037637 A | * | 2/1988 | H01L/21/90 |
| JP | 03067225 A | * | 3/1991 | G02F/1/13 |

OTHER PUBLICATIONS

Hideki Shibata, "Low–K Interlayer Dielectric Technology for High Performance LSIs", Densijyouhoutsuusin Gakkai-shi, Mar. 1997, vol. 80, No. 3 pp. 235–239.

S.V. Nguyen, et al., "Plasma–Assisted Chemical Vapor Deposition and Characterization of Boron Nitride Films", J. Electrochem. Soc., Jun. 1994, vol. 141, No. 6, pp. 1633–1638.

W.F. Kane, et al., "Use of SiBN and SiBON Films Prepared by Plasma Enhanced Chemical Vapor Deposition from Borozine as Interconnection Dielectrics", J. Electrochem. Soc., Feb. 1997, vol. 144, No. 2, pp. 658–663.

Masahiko Maeda, et al., "Low Dielectric Constant Amorphous SiBN Ternary Films Prepared By Plasma–Enhanced Deposition", Japanese Journal of Applied Physics, May 1987, vol. 26, No. 5, pp. 660–665.

* cited by examiner

*Primary Examiner*—Olik Chaudhuri
*Assistant Examiner*—Erik Kielin
(74) *Attorney, Agent, or Firm*—Oblon, Spivak, McClelland, Maier & Neustadt, P.C.

(57) ABSTRACT

There is provided a film, which is excellent in thermal resistance, has low dielectric constant, and is applicable to a semiconductor device or electric appliances. The low dielectric constant film having thermal resistance comprises molecules comprising boron, nitrogen, and hydrogen, wherein the number of the nitrogen atom is 0.7 to 1.3 and the number of the hydrogen atom is 1.0 to 2.2 based on one boron atom, and of which dielectric constant is at most3 2.4.

8 Claims, No Drawings

LOW DIELECTRIC CONSTANT FILM COMPOSED OF BORON, NITROGEN, AND HYDROGEN HAVING THERMAL RESISTANCE, PROCESS FOR FORMING THE FILM, USE OF THE FILM BETWEEN SEMICONDUCTOR DEVICE LAYERS, AND THE DEVICE FORMED FROM THE FILM

BACKGROUND OF THE INVENTION

The present invention relates to the insulation film used between semiconductor device layers, and the low dielectric constant material having thermal resistance of a semiconductor device, which is applicable for electric circuit appliances.

Along with improvement in speed and high integration of a semiconductor device, the problem of signal retardation has become serious. The signal retardation is expressed with the product of resistance R of a wire and capacity C between wires and between layers. In order to suppress the retardation to the minimum, it is an effective means to lower the dielectric constant of an insulation film between layers, as well as to lower resistance of wiring.

Recently, in order to lower the dielectric constant of an insulation film between layers, there is proposed a method for forming an insulation film between layers using a silicon oxide film (SiOF film) wherein the fluorine atom is incorporated. Moreover, since an organic compound material can relatively lower dielectric constant, there is proposed a method for forming an insulation film between layers by using a parylene deposit film or a polyimide film wherein a fluorine atom is incorporated (Hideki Shibata, Densijyouhoutsuusin Gakkaishi Vol.80, No.3 p235(1997)).

By the way, the dielectric constant of the insulation film between layers becomes lower than that of the conventional film, when the insulation film between layers is formed by the above SiOF film. However, a dielectric constant thereof becomes about 3.2 to 3.5, capacity between wires can not be reduced and signal propagation de of wires can not be sufficiently prevented.

Moreover, the dielectric constant 2.7 is attained by using the film wherein the fluorine atom is incorporated into the polyimide and aryl ether polymer, when an insulation film between layers is formed with the organic compound material mentioned below. But it is not still sufficient. By using deposit film of parylene dielectric constant 2.4 can be attained, but the process for preparing a semiconductor device is limited, since thermal resistance is only about 200 to 300° C.

The dielectric constant of 2.0 to 2.5 has been reported in porous $SiO_2$ film. But there is a problem that mechanical strength (CMP polishing process resistance) is low due to high porosity, and a pore diameter varies.

Since thermal conductivity of these polymeric materials and porous $SiO_2$ film is lower than that of the conventional insulation film between layers of $SiO_2$, there is a problem that the wiring life is degraded (electromigration) by the wire temperature rise.

As mentioned above, the insulation film between layers has been desired, which has low dielectric constant and is excellent in thermal resistance, mechanical strength, and the thermal conductivity. Concretely, in design-rule 0.13 to 0.10 μm, the film is required, which has mechanical strength and thermal conductivity not less than an $SiO_2$ film, dielectric constant of at most 2.4, and thermal resistance (thermal decomposition temperature) of at least 450° C.

SUMMARY OF THE INVENTION

The object of the present invention is to provide the low dielectric constant film having thermal resistance, which is excellent in thermal resistance, has low dielectric constant and can be applied to appliances of semiconductor device and electric circuit, and the process for forming the same.

The low dielectric constant film having thermal resistance of the present invention comprises molecules comprising boron, nitrogen, and hydrogen, wherein the number of nitrogen atom is 0.7 to 1.3 and the number of hydrogen atom is 1.0 to 2.2 based on one boron atom, and of which dielectric constant is at most 2.4.

The low dielectric constant film having thermal resistance of the present invention has thermal decomposition temperature of at least 450° C. in the above low dielectric constant film having thermal resistance.

The process for forming the low dielectric constant film having thermal resistance of the present invention is the process wherein the process for forming the low dielectric constant film having thermal resistance on the substrate surface is the process for forming the low dielectric constant film having thermal resistance according to chemical vapor deposition.

The process for forming the low dielectric constant film having thermal resistance of the present invention is the process wherein gas containing diborane and gas containing annonia are used as raw gas in the chemical vapor deposition in the process for forming the low dielectric constant film having thermal resistance.

The process for forming the low dielectric constant film having thermal resistance of the present invention is the process wherein gas containing diborane is used as raw gas in the chemical vapor deposition in the process for forming the low dielectric constant film having thermal resistance.

The insulation film between semiconductor layers of the present invention is the insulation film between semiconductor layers comprising the low dielectric constant film having thermal resistance.

The insulation film between semiconductor layers of the present invention is the insulation film between semiconductor layers obtained by the process for forming the low dielectric constant film having thermal resistance.

The semiconductor device of the present invention is the semiconductor device comprising the insulation film between semiconductor layers.

DETAILED DESCRIPTION

Example of the compound in the film of the present invention comprising molecules comprising boron, nitrogen and hydrogen, wherein the number of nitrogen atom is 0.7 to 1.3 and the number of hydrogen atom is 1.0 to 2.2 based on one atom of boron, is concretely borazine shown in the following formula (1) (which is called as inorganic benzene or borazol).

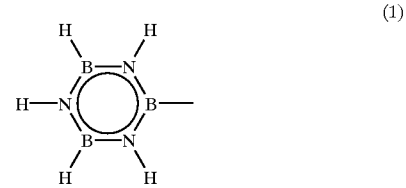
(1)

The compounds obtained by molecular propagation of the structure shown in the above formula (1) and the derivative structure as thereof as a basic unit are suitable for the low dielectric constant film having thermal resistance of the present invention. The low dielectric constant film having thermal resistance comprising the compounds can be applied for the insulation film between semiconductor layers, and by using the insulation film the excellent semiconductor device can be prepared.

The reasons why the material (or compound) of the present invention can lower the dielectric constant and achieve dielectric constant of at most 2.4 are follows.

That is, the dielectric constant ε is generally described with sum of polarization such as electron polarization, atom polarization, orientation polarization, and interface polarization. But it is sufficient to consider only the electron polarization and the atom polarization as polarization controlling dielectric constant, as long as there is no contribution of interfacial polarization in the high frequency region of at least 1 MHz in the present invention and there is used the material showing no orientation. The present invention is completed by results of molecular design for searching the material with the small polarizability of both electron polarization and atomic polarization.

If molecular polarizability a is defined as $$\alpha = \alpha \text{ (electron polarization)} + \alpha \text{ (atom polarization)}$$

dipole-moment $\mu$ of a molecule is given as a function of an electric field E and basic coordinate q of a molecule. The electron polarization and the atom polarization can be evaluated by differentiating the dipole moment $\mu$ with the electric field E.

$$d\mu(E,q)/dE = \delta\mu(E,q)/\delta E \delta\mu(E,q)/\delta q \delta\mu/\delta E$$

$$\alpha(\text{electron polarization}) = \delta\mu(E,q)/\delta E$$

$$\alpha \text{ (atom polarization)} = \delta\mu(E,q)/\delta q \, \delta\mu/\delta E$$

$$= \delta\mu/\delta q (\delta^2 E/\delta q \, \delta q)^{-1} \delta\mu/\delta q$$

$$= \delta\mu/\delta q (\kappa)^{-1} \delta\mu/\delta q$$

As shown above, the atom polarization is in inverse proportion to bonding strength κ (force constant) between atoms.

Next, concrete calculation method of the polarizability a is explained as follows. Dielectric constant ε of fluorinated parylene is 2.4 as mentioned above, and molecular orbital calculation was carried out in the model compounds shown in the following formula (2) to (7). Table 1 collectively shows the results of calculation.

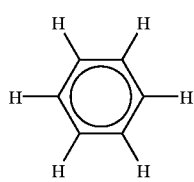

(2)

-continued

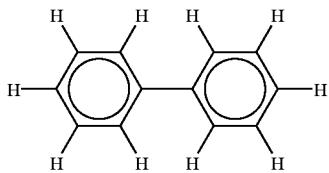

(3)

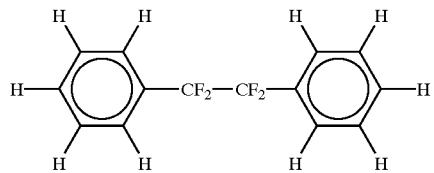

(4)

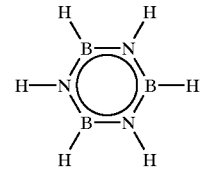

(5)

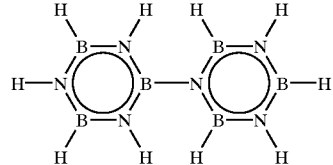

(6)

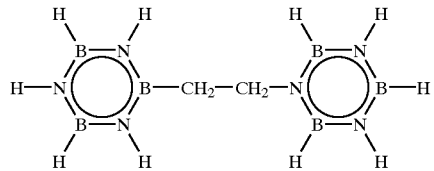

(7)

TABLE 1

| | formula 2 | formula 3 | formula 4 | formula 5 | formula 6 | formula 7 |
|---|---|---|---|---|---|---|
| α (election polarization) | 48 | 103 | 120 | 39 | 87 | 101 |
| α (atom polarization) | 0.11 | 0.21 | 1.35 | 1.81 | 3.92 | 3.76 |
| (molecular polarizability) α | 48.11 | 103.21 | 121.35 | 40.81 | 90.92 | 104.76 |

As is clear from Table 1, it is found out that molecular polarizability a in the borazine system (formula (5), (6) and (7)) is smaller than that in the hydrocarbon system (formula (2), (3) and (4)). Namely, the borazine system theoretically shows a small dielectric constant. The molecular polarizability ratios of each system are as follows, respectively.

Formula (5) Formula (2)=0.85
Formula (6) Formula (3)=0.88
Formula (7) Formula (4)=0.86

It shows that it is predicted that dielectric constant ε of the borazine system (formula (7)) is 2.0 to 2.1, since the dielectric constant F of fluorinated parylene (formula (4)) is 2.4.

From the calculation results, the compound containing borazine skeleton molecule in its molecule can make dielectric constant at most 2.4. Concrete examples are the compounds satisfying that the number of nitrogen atom is 0.7 to 1.3 and the number of hydrogen atom is 1.0 to 2.2 based on one atom of boron, in the film comprising the molecules comprising boron, nitrogen, and hydrogen. The number of nitrogen is preferably 0.8 to 1.1, and the number of hydrogen atom is preferably 1.0 to 1.5. If the number of nitrogen atom is out of the range, an amount of the borazine skeleton becomes too small in the molecule, dielectric constant becomes large to above 2.4. If the number of hydrogen atom is out of the range, an amount of the borazine skeleton becomes too small in the molecule, dielectric constant $\epsilon$ becomes large to above 2.4 due to graphitization. The dielectric constant is preferably at most 2.2. If the dielectric constant is more than 2.4, signal tends to be delayed in the semiconductor device.

Therefore, concrete examples of the present invention are the materials containing the structure shown in the following formula (8) to (12) in its molecule

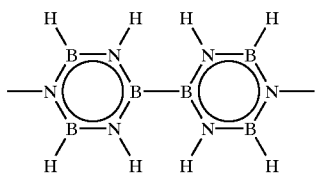
(8)

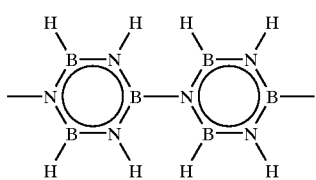
(9)

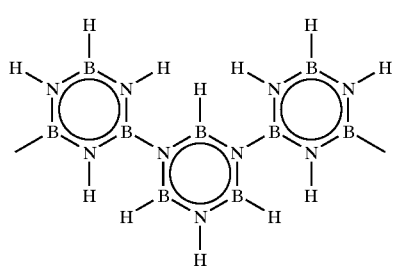
(10)

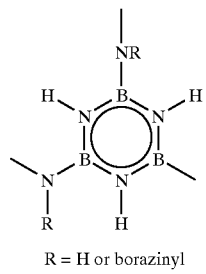
(11)

R = H or borazinyl

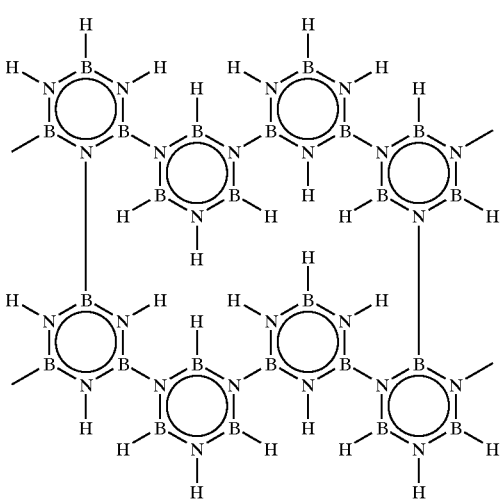
(12)

The present invention can improve thermal resistance, since the inorganic polymer material is used, which is excellent in thermal resistance compared with the organic polymer material.

The low dielectric constant film having thermal resistance of the present invention comprising boron, nitrogen, and hydrogen can be prepared by the method described in, for example, S. V. Nguyen, T. Nguyen, H. Treichel, O. Spindler, J.Electrochem.Soc., Vol.141, No.6, p1633(1994), W. F. Kane, S. A. Cohen, J. P. Hummel, B. Luther, J.Electrochem.Soc., Vol.144, No.2, p658(1997), M. Maeda, T. Makino, Japanese Journal of Applied Physics, Vol.26, No.5, p660(1987), and the like. Namely, the film can be obtained according to a condensation reaction with chemical vapor deposition (CVD method) by using diborane ($B_2H_6$) and ammonia (NH3), or borazine ($B_3N_3H_6$) and nitrogen ($N_2$) as a raw material. The thickness of the film is preferably 0.3 to 0.8 $\mu$m.

Gas containing diborane and gas containing ammonia are preferably used as the raw gas from the viewpoint of gas vapor pressure suitable for CVD and condensation reactivity. Gas containing borazine is more preferably used as the raw gas from the viewpoint of the amount of a borazine skeleton structure after condensation reaction by CVD.

In the above synthesis inert gas such as argon (Ar) may be used as carrier gas of the material.

A conventional plasma CVD device may be used as a device for chemical vapor deposition (CVD) used in the present invention.

In addition, the polymer is excellent in thermal stability, although it is necessary to handle borazine carefully since borazine may be ignited spontaneously in air.

The thermal decomposition temperature of the low dielectric constant film having thermal resistance is preferably at least 450° C., more preferably at least 480° C. If the temperature is less than 450° C., there is a tendency that the thin film becomes bad at heating in the preparation process for a semiconductor device.

The low dielectric constant film having thermal resistance can be used for the low dielectric constant film having thermal resistance as it is, but the formed film may be annealed at not more than 800° C. (temperature in which graphitization is not largely carried out).

The low dielectric constant film having thermal resistance of the present invention can be applied to various electric appliances such as an insulation film between layers for LSI device and IC substrate.

Next, the low dielectric constant material of the present invention is concretely explained by using examples.

EXAMPLE 1

According to the method of S. V. Nguyen et al., (S. V. Nguyen, T. Nguyen, H. Treichel, 0. Spindler, J.Electrochem.Soc., Vol.141, No.6, p1633(1994)), plasma polymerization was carried out by using a plasma CVD device (RF: 13.56MHz), and borazine:($B_3N_3H_6$) and nitrogen ($N_2$) as a raw material to deposit polymerization product onto the quartz plate deposited with gold as a counterelectrode. The thickness of the obtained deposit film was 0.4 $\mu$m, and the thermal decomposition temperature was 480° C.

EXAMPLE 2

Polymerization product was deposited in the same manner as in Example 1 except that mixed gas of diborane ($B_2H_6$)/nitrogen ($N_2$) =1/100, ammonia ($NH_3$) and nitrogen ($N_2$) were used. The thickness of the obtained film was 0.7 $\mu$m, and the thermal decomposition temperature was 465° C.

Gold was deposited as a main electrode onto the deposit film obtained in Examples 1 to 2, and dielectric constants thereof were measured at 25° C. and 1 MHz by using an impedance analyzer (4191A made by Hewlett Packard). Results of measurement are collectively shown in Tables 2 and 3.

TABLE 2

| sample symbol | Example 1 | | | | |
|---|---|---|---|---|---|
| | A | B | C | D | E |
| flow rate (sc-cm) $B_3N_3H_6$ | 100 | 100 | 100 | 100 | 100 |
| $B_2H_6/N_2$ | — | — | — | — | — |
| $NH_3$ | — | — | — | — | — |
| $N_2$ | 100 | 100 | 100 | 100 | 100 |
| input power (W) | 100 | 100 | 100 | 100 | 100 |
| vacuum (Torr) | 2 | 2 | 2 | 2 | 2 |
| substrate temperature (° C.) | 300 | 250 | 200 | 200 | 150 |
| element ratio (B:N:H) | 1:1:1.5 | 1:0.9:1.4 | 1:0.9:1.3 | 1:1.1:1.3 | 1:1.1:1.3 |
| dielectric constant ($\epsilon$) | 2.16 | 2.25 | 2.26 | 2.31 | 2.35 |

TABLE 3

| sample symbol | Example 2 | | | | |
|---|---|---|---|---|---|
| | F | G | H | I | J |
| flow rate (sc-cm) $B_3N_3H_6$ | — | — | — | — | — |
| $B_2H_6/N_2$ | 1000 | 1000 | 1000 | 1000 | 1000 |
| $NH_3$ | 100 | 100 | 100 | 100 | 100 |
| $N_2$ | 2000 | 2000 | 2000 | 2000 | 2000 |
| input power (W) | 200 | 200 | 400 | 200 | 400 |
| vacuum (Torr) | 4 | 4 | 4 | 4 | 4 |
| substrate temperature (° C.) | 250 | 300 | 300 | 300 | 350 |
| element ratio (B:N:H) | 1:1.2:1.3 | 1:1.2:1.3 | 1:1.2:1.3 | 1:1.2:1.5 | 1:1.3:1.6 |
| dielectric constant ($\epsilon$) | 2.36 | 2.33 | 2.29 | 2.31 | 2.34 |

The films A to J obtained in Examples 1 to 2 have dielectric constant of at most 2.4. These results show that the film having low dielectric constant can be obtained, which is the object of the present invention.

It is thought that the deposit films have the structure shown

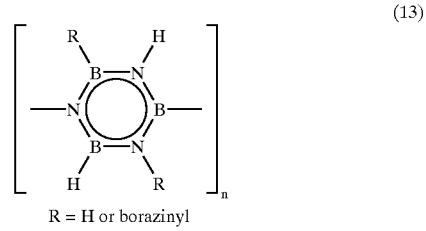

(13)

R = H or borazinyl

These films are dehydrogenated and graphitized by heating at 1,000 to 1,200° C., but they have thermal resistance of 450° C. sufficiently.

According to the present invention, there can be provided the low dielectric constant film having thermal resistance, which has specific dielectric constant of at most 2.4 and thermal resistance of at least 450° C.

According to the insulation film between semiconductor layers, high speed of the device can be achieved, since electronic signal retardation becomes small by applying the low dielectric constant film having thermal resistance to a semiconductor device such as an insulation film between layers for LSI and a IC substrate, or electric appliances.

What is claimed is:

1. A low dielectric constant film having thermal resistance comprising molecules comprising boron, nitrogen, and hydrogen, wherein the number of the nitrogen atom is 0.7 to 1.3 and the number of the hydrogen atom is 1.0 to 2.2 based on one boron atom, and of which dielectric constant is at most 2.4.

2. The low dielectric constant film having thermal resistance of claim 1, wherein thermal decomposition temperature is at least 450° C.

3. A process for forming the low dielectric constant film having thermal resistance of claim 1, wherein the process for forming the low dielectric constant film having thermal resistance on a substrate surface is chemical vapor deposition.

4. The process for forming the low dielectric constant film having thermal resistance of claim 3, wherein gas containing diborane and gas containing ammonia are used as raw gas in the chemical vapor deposition.

5. The process for forming the low dielectric constant film having thermal resistance of claim 3, wherein gas containing borazine is used as raw gas in the chemical vapor deposition.

6. An insulation film between semiconductor layers, comprising the low dielectric constant film having thermal resistance of claim 1.

7. An insulation film between semiconductor layers, which is prepared by the process for forming the low dielectric constant film having thermal resistance of claim 3.

8. A semiconductor device comprising the insulation film between semiconductor layers of claim 6.

* * * * *